(12) United States Patent
Ohmori et al.

(10) Patent No.: US 8,497,139 B2
(45) Date of Patent: Jul. 30, 2013

(54) MAGNETIC MEMORY DEVICE AND METHOD OF MANUFACTURING THE SAME

(75) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 177 days.

(21) Appl. No.: 13/192,995

(22) Filed: Jul. 28, 2011

(65) Prior Publication Data
US 2012/0032289 A1    Feb. 9, 2012

(30) Foreign Application Priority Data

Aug. 6, 2010 (JP) .................................. 2010-177104

(51) Int. Cl.
*H01L 29/82* (2006.01)
*G11C 11/02* (2006.01)
(52) U.S. Cl.
USPC ............... 438/3; 257/421; 257/422; 257/423; 257/427; 257/E29.323; 360/324.2; 365/157; 365/158; 365/171; 365/172; 365/173

(58) Field of Classification Search
None
See application file for complete search history.

(56) References Cited

U.S. PATENT DOCUMENTS
2008/0293183 A1* 11/2008 Tsukamoto et al. .......... 438/102

FOREIGN PATENT DOCUMENTS
JP    2004-193595    7/2004
JP    2009-081215    4/2009

* cited by examiner

*Primary Examiner* — Jami M Valentine
(74) *Attorney, Agent, or Firm* — Dentons US LLP (57) ABSTRACT

A magnetic memory device including a memory layer having a vertical magnetization on the layer surface, of which the direction of magnetization is changed according to information; and a reference layer provided against the memory layer, and being a basis of information while having a vertical magnetization on the layer surface, wherein the memory device memorizes the information by reversing the magnetization of the memory layer by a spin torque generated when a current flows between layers made from the memory layer, the nonmagnetization layer and the reference layer, and a coercive force of the memory layer at a memorization temperature is 0.7 times or less than a coercive force at room temperature, and a heat conductivity of a center portion of an electrode formed on one side of the memory layer in the direction of the layer surface is lower than a heat conductivity of surroundings thereof.

4 Claims, 9 Drawing Sheets

MAGNETIC MEMORY DEVICE AND METHOD OF MANUFACTURING THE SAME

BACKGROUND

The present disclosure relates to a magnetic memory device which is laminated by a plurality of vertical magnetization layers including a memory layer and a reference layer through a nonmagnetic substance, and memorizes information by reverse magnetization in a spin torque generated when a current flows between these layers, and a method of manufacturing the magnetic memory device.

In information devices such as computers, high density DRAM (Dynamic Random Access Memory) operating at high speed is widely used as a RAM (Random Access Memory). However, since DRAM is a volatile memory in which the information disappears when power is turned off, a nonvolatile memory from which the information does not disappear is necessary.

As a nonvolatile memory candidate, MRAM (Magnetic Random Access Memory) memorizing information by magnetizing magnetic material has attracted attention and is undergoing development.

As a method of memorizing MRAM memorization, there is a method of reversing the magnetization by a current magnetic field, for example, as disclosed in Japanese Unexamined Patent Application Publication No. 2004-193595, involving inducing a magnetization reversal by injecting spin polarized electrons into a memory layer directly. In particular, spin injection magnetization reversal, which can reduce current for memorization and reduce the size of the device, has received attention.

Furthermore, in order to refine the device, as disclosed in Japanese Unexamined Patent Application Publication No. 2009-81215, for example, a method for utilizing a vertically magnetized layer which enables the magnetization direction of a magnetic material to become vertical is being studied.

SUMMARY

However, in order to realize an even higher density magnetic memory, a magnetic memory device operable at high speed with lower current is necessary.

Since the disclosure is based on recognition of this fact, it is desirable to realize a magnetic memory device operable at high speed with low current.

A magnetic memory device according to the present disclosure includes a memory layer having a vertical magnetization on the layer surface and changing the direction of the magnetization of the memory layer according to information, and a reference layer which is provided against the memory layer through a nonmagnetization layer and which is a basis of information while having vertical magnetization on the layer surface, wherein the memory device memorizes the information by reversing the magnetization of the memory layer by a spin torque generated when a current flows between layers made from the memory layer, the nonmagnetization layer, and the reference layer. Furthermore, a coercive force of the memory layer at a memorization temperature is equal to or less than 0.7 times a coercive force at room temperature, and the heat conductivity of a center portion of the electrode formed on one side of the memory layer in the direction of the layer surface is lower than the heat conductivity of its surroundings.

For example, the electrode is formed to substantially have a concave cross section, the thickness of the center portion of the electrode is thinner than that of the surroundings of the electrode, and an insulator of low heat conductivity is filled into a depressed portion formed at the center portion.

Alternatively, the electrode has a tube-like shape, and an inner part of the tube-like shape is filled with an insulator of low heat conductivity.

A method of manufacturing a magnetic memory device of the present disclosure includes forming a structure of layers of at least the reference layer, the nonmagnetization layer, and the memory layer on one side of the electrode of the reference layer, wherein a coercive force of the memory layer at a memorization temperature is 0.7 times or less than a coercive force at room temperature. Furthermore, the method includes forming another electrode on one side of the memory layer, wherein this another electrode is filled with an insulator of low heat conductivity, and the heat conductivity of a center portion of the electrode in the layer surface direction is lower than the heat conductivity of its surroundings.

As the magnetic memory device, although implementing memorization by use of a spin torque caused by spin injection magnetization reversal method can reduce the current during memorization, there is a limit on reducing current with this alone. Therefore, it is desirable to enable the current for magnetization reversal to be reduced by using heat in memorization effectively.

A demagnetizing field of the vertical magnetization layer which configures the memory layer is strong at the center portion in the direction of the layer surface. Also, magnetization reversal happens easily at the central part.

Therefore, in the electrode of the memory layer side, the heat conductivity is set to be lower at the center portion thereof in the direction of the layer surface rather than at the surroundings thereof. For example, it is preferable to facilitate the temperature increase by arranging a material of low heat conductivity. Therefore, it is possible to effectively raise the temperature at the center portion of the layer surface of a memory layer, reduce the voltage for magnetization reversal, and reduce current for memorization and time for memorization.

In particular, this effect is obtainable to a remarkable extent when the structure of the memory layer is formed such that a coercive force of the memory layer at a memorization temperature (about 200° C.) is 0.7 times or less than that at room temperature (for example, 23° C.).

It is possible to realize a nonvolatile memory operable at high speed with low current by the present disclosure.

DETAILED DESCRIPTION OF EMBODIMENTS

Hereinafter, the embodiments of the disclosure are described in the following order.
<1. Overview of a magnetic memory structure>
<2. One example of the structure of a magnetic memory device of an embodiment>
<3. The first example of the structure and a manufacturing order>
<4. The second example of the structure and a manufacturing order>
<5. The third example of the structure and a manufacturing order>
<6. The fourth example of the structure and a manufacturing order>
<7. Embodiment>
<1. Overview of a Magnetic Memory Structure>

Figure 1:
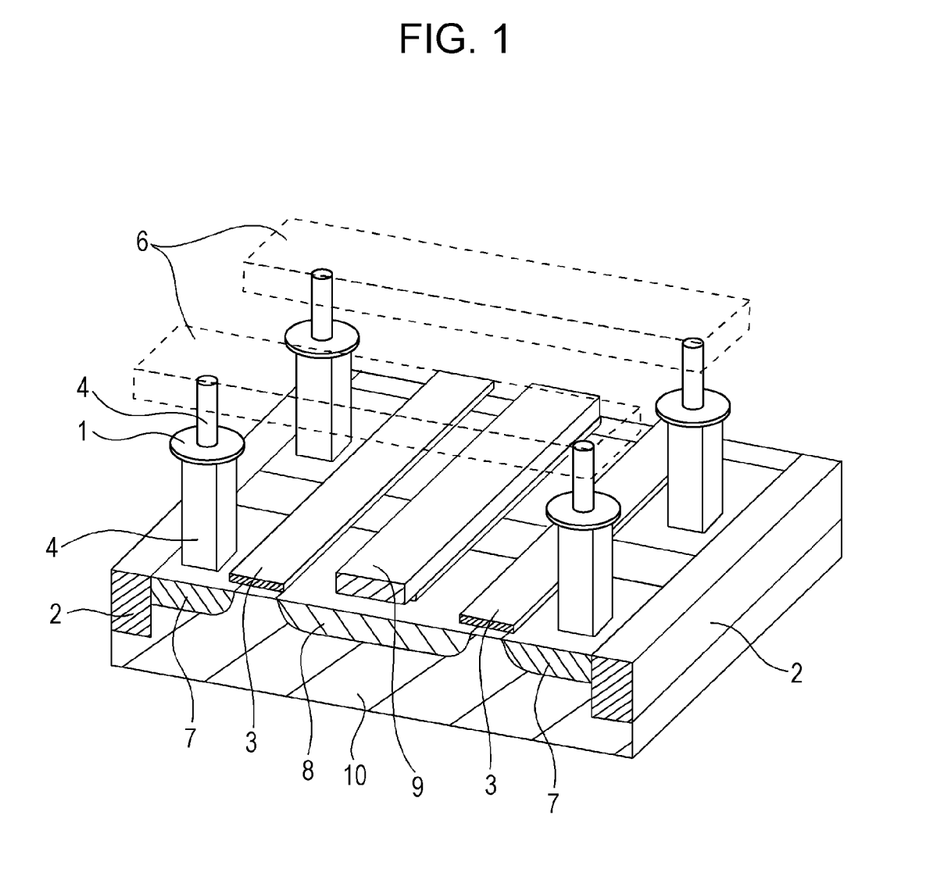
FIG. 1 is a view illustrating a magnetic memory in which a magnetic memory device is used according to the embodiment of the present disclosure.

First, the magnetic memory structure which is used as the magnetic memory device according to an embodiment of the present disclosure will be explained. FIG. 1 schematically shows an overview of the structure of the magnetic memory.

The magnetic memory 10 includes two types of address wirings intersecting each other, for example, a word line and a bit line, and the magnetic memory device 1 is located in the vicinity of the intersection between the two types of address wirings. The magnetic memory device 1 includes a structure as an embodiment described below.

In a magnetic memory 10, a drain area 8, a source area 7, and a gate electrode 3 configuring a transistor for selecting the corresponding memory device 1 are formed individually in a region separated by a device separating layer 2 of a semiconductor substrate, such as, for example, Si, or the like.

The gate electrode 3 also has a role as the wiring for addressing (for example, word line) which is elongated forward and backward in FIG. 1.

The drain area 8 is commonly formed between transistors for selecting right and left in FIG. 1, and this drain area 8 is connected with the wiring 9.

The magnetic memory device 1 is also arranged between the source region 7 and the other side of wiring 6 (for example, bit line) for addressing which is extended to the left and right in FIG. 1 disposed on upper side. The magnetic memory device 1 includes a memory layer which has the vertical magnetization and made of a ferromagnetic layer, the magnetization direction of which is reversed by a spin injection, and a reference layer having the magnetization direction which is a reference for information memorized in the memory layer.

Also, the magnetic memory device 1 is located in the vicinity of intersection between the gate electrode 3 and the wiring 6 which are two types of address lines, and connected with the upper and lower contact layers 4. Therefore, it is possible to conduct electric current up and down to the magnetic memory device 1 through two types of lines, in other words, the gate electrode 3 and the wiring 6, and, by spin injection, it is possible to enable reversing of the magnetization direction of the memory layer corresponding to the information.

On the other hand, the structure shown in FIG. 1 is only one example for explaining the magnetic memory. Therefore, for example, it is possible to form the wiring 6 without providing the contact layer 4 on the magnetic memory device 1.
<2. One Example of the Structure of a Magnetic Memory Device of an Embodiment>

As illustrated above, according to the disclosure, it is possible to operate the magnetic memory device using a vertical magnetization layer at high speed with a lower current.

The inventors of the present disclosure carried out varied research to accomplish above matters, and as a result found that it is preferable to form the magnetic memory device having the reference layer and the memory layer having a vertical magnetization and laminated through a nonmagnetization layer as follows.

In other words, while making a coercive force of the memory layer at a memorization temperature (about 200° C.) 0.7 times or less than a coercive force at room temperature (about 23° C.), the structure and material of the electrode has a property in which the heat conductivity of a center portion of the electrode is lower than the heat conductivity of its surroundings seen from the layer surface direction of the memory layer.

Then, because of the heat generated during a memorization process, the temperature at the center portion of the device becomes significantly higher than the temperature at the surroundings of the device so that a reverse magnetic area which causes reverse magnetization at the center portion of the device is likely to be formed. Therefore, a magnetic memory device capable of memorization at high speed with a lower current is realized.

As a simple structure capable of forming the above mentioned temperature distribution, a metal layer is formed to be thinner than the depth of the hollow in the hollow which is formed in the insulator separating the upper and lower electrodes of the magnetic memory device in order to take conductivity with the magnetic memory device, and an insulator of low heat conductivity is provided to the center portion where there is no metal to fill the hollow.

Because of this structure, the heat conductivity of the center portion of the memory layer declines and the heat conductivity of the surrounding rises, so that the temperature of the center portion is likely to rise during memorization.

Also, in order to augment the difference of heat conductivity, by removing at least one portion of the metal layer formed at the bottom of the hollow of the metals, making the layer thinner, or setting aside the periphery of the hollow, and thereby forming a cylindrical electrode, it is possible to generate a greater temperature difference in the memory layer.

The metals used as the electrode of the magnetic memory device of the present disclosure are preferably Cu and Al or the like with a high heat conductivity, but W and tantalum or the like with a slightly low heat conductivity may be sufficient. As an insulator with low heat conductivity, porous silicon oxide, organic matter or the like is applied, however, general silicon oxide or the like can be used.

Figure 2A:
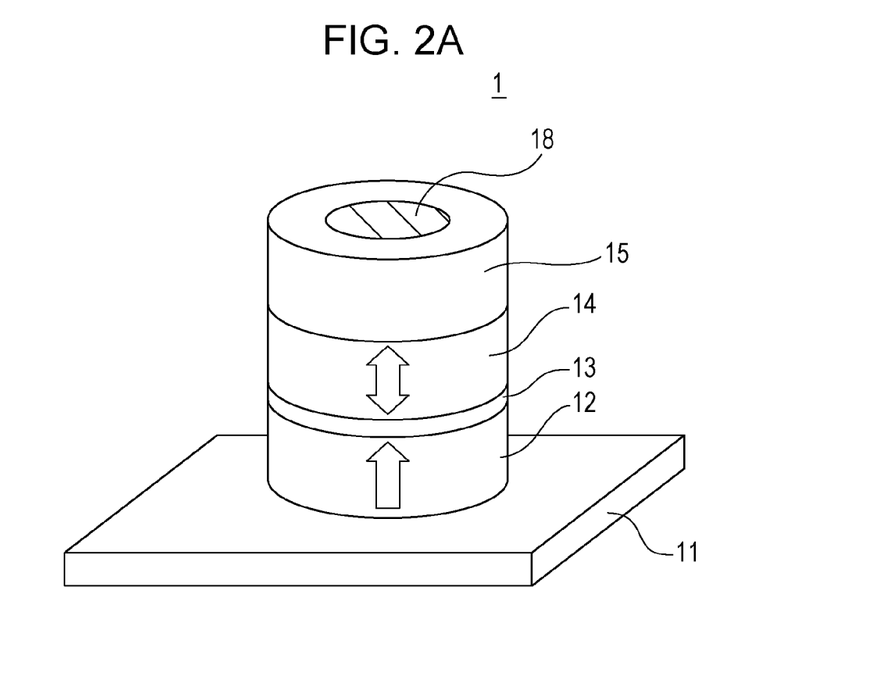
FIGS. 2A and 2B are a view illustrating the structure of a magnetic memory device according to the embodiment.
Figure 2B:
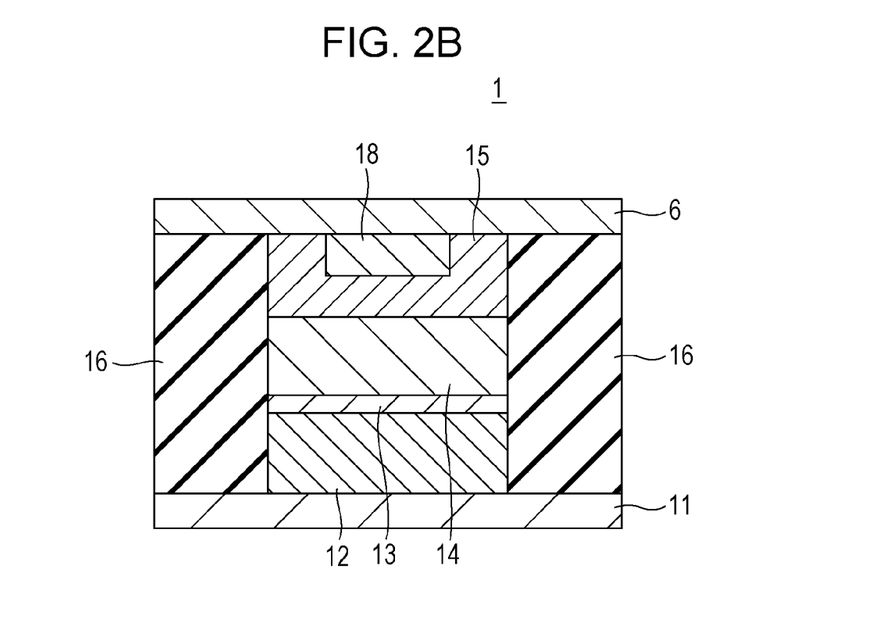

FIGS. 2A and 2B are a structure example of a magnetic memory device 1 according to the embodiment of the disclosure. FIG. 2A shows the magnetic memory device having a cylindrical shape, FIG. 2B shows the cross section thereof.

Figure 3A:
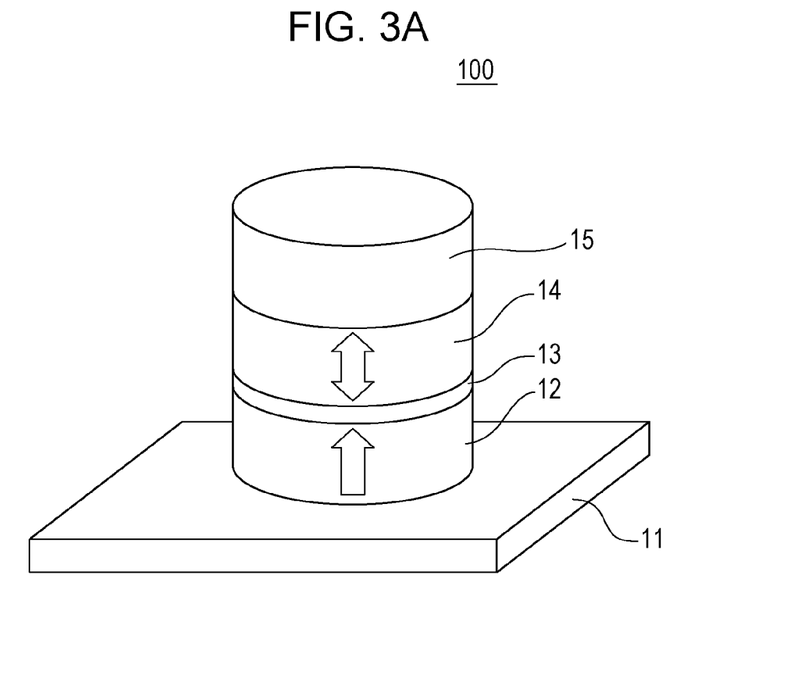
FIGS. 3A and 3B are a view illustrating the structure of a general magnetic memory device as a comparative example.
Figure 3B:
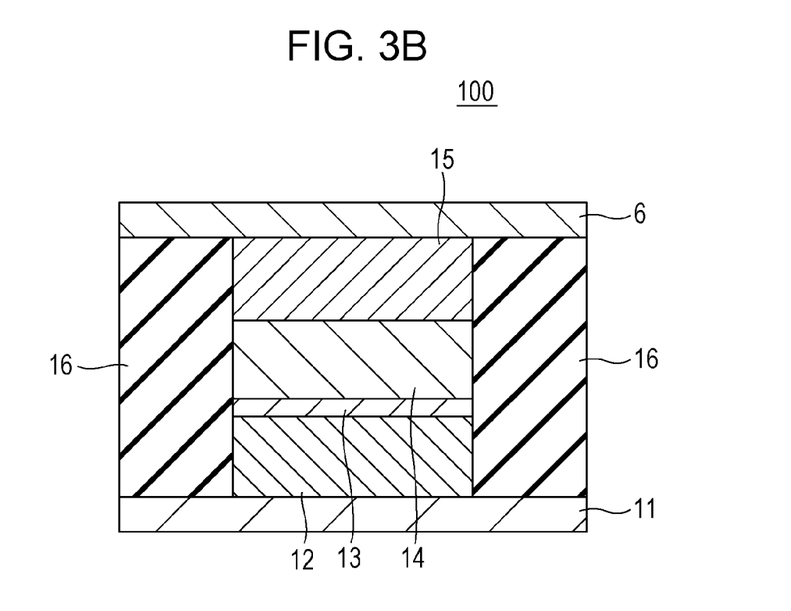

One structure example of a general magnetic memory device 100 is shown in FIGS. 3A and 3B similarly to FIGS. 2A and 2B in order to allow comparison.

As shown in FIGS. 2A and 2B, the magnetic memory device 1 with vertical magnetization according to an embodiment includes at least a reference layer (magnetization fixed layer) 12, a nonmagnetization (tunnel barrier layer) 13, and a memory layer 14, laminated between a lower electrode 11 and an upper electrode 15.

As shown in FIG. 2B, a wiring 6 is formed on top of the upper electrode 15.

In FIG. 2A, the arrows in the memory layer 14 and the reference layer 12 denote the magnetization direction, and the arrow of the memory layer 14 denotes that the vertical magnetization direction is reversed by spin injection.

The memory layer 14 is a ferromagnet having a magnetic moment, the magnetization direction of which freely changes vertically against the layer surface.

The reference layer 12 is a ferromagnet having a magnetic moment, the magnetization of which is fixed to the vertical direction against the layer surface.

The process of memorizing information is performed by the direction of magnetization of the memory layer 14 which has a property of single-axis anisotropy. The write operation is performed by applying a current to the direction vertical against the layer surface and generating spin torque magnetization reversal. In this way, since the reference layer 12 is provided as a magnetization fixed layer provided at an underlayer with respect to the memory layer 14 of which the magnetization direction is reversed by spin injection, the reference layer 12 is considered as a reference for the memory information (magnetization direction) of the memory layer 14.

The memory layer 14 includes magnetic materials which have a property of perpendicular anisotropy. These magnetic materials include rare earth element-transition metal alloys such as TbCoFe, metal multi-layers such as Co/Pd multi-layers, and ordered alloys such as FePt.

Also, it is preferable to use MgO as a nonmagnetization layer (tunnel barrier layer) 13 in order to realize a high magnetoresistance change ratio which provides a large read-out signal in the spin injection magnetic memory device 1.

A magnetic layer with a high reversion current is used as the reference layer 12. A high performance memory device is achieved by using a magnetic layer having a higher reversion current than the memory layer 14.

For example, an alloy with the main component Co, which includes at least one of Cr, Ta, Nb, V, W, Hf, Ti, Zr, Pt, Pd, Fe, and Ni, is used as the reference layer 12. For example, it is possible to use CoCr, CoPt, CoCrTa, CoCrPt, and the like. Also, it is possible to use amorphous alloys of Tb, Dy, Gd and transition metals. For example, it is possible to use TbFe, TbCo, TbFeCo, and the like.

Also, the reference layer 12 can be formed by only a ferromagnetic layer, and be formed as well by a laminated ferromagnetic structure laminated by a number of ferromagnetic layers through a tunnel barrier layer.

The basic layer structure explained above is the same as the general magnetic memory device 100, as can be seen by referring to FIGS. 3A and 3B.

The magnetic memory device 1 of the present embodiment is different from the general magnetic memory device 100 in FIGS. 3A and 3B in that a low heat conductivity part 18 is formed in the internal part of the upper electrode 15.

For example, in FIG. 2B, the thickness of the cross section of the central part of the upper electrode 15 in the direction of the layer surface is thinner than that of the circumference part of the upper electrode 15 so that the cross section is approximately a concave shape, and an insulator of low heat conductivity is filled into the depressed portion formed in the center portion so as to form the low heat conductivity part 18.

By the low heat conductivity part 18, it is possible to set the heat conductivity of surroundings seen from the layer surface direction of the memory layer 14 having a circular layer surface high and set the heat conductivity of the center portion low. Then, because of the heat generated during the memorization process, the temperature of the central part of the device becomes much higher than that of the circumference part of the device, whereby it becomes easy to form a reverse magnetic area which will be a cause of reverse magnetization in the central part of the device.

Also, although the reference layer 12 is located under the memory layer 14 in FIGS. 2A and 2B, it does not matter whether the memory layer 14 is located under the reference 12 or vice versa.

Also, the shape of the memory layer 14 of the magnetic memory device 1 having a memory layer 14 with vertical magnetization may preferably be a cylindrical shape or a cone-like shape, and a shape such as a cylindroid or elliptical cone-like shape with low aspect ratio is preferable.

Although it is preferable to form the shape of the reference layer 12 with the same shape as the memory layer, the shape is not important if the reference layer 12 is under and larger than the memory layer 14.

Also, usually, as shown in FIG. 2B, the surroundings of the magnetic memory device 1 are filled up with the insulator 16.

FIGS. 3A and 3B show a method for manufacturing a magnetic memory device 100 including the reference layer 12, nonmagnetization layer 13, the memory layer 14, and electrode material, which are laminated and components of the magnetic memory device 100. Next, after coating a photoresist, a resist of a device shape is left, and the shape of the device is formed under the resist by ion milling or reactive ion etching. Then, the insulating layer 16 is formed, a polishing process is conducted until the upper electrode 15 is exposed, and wiring 17 is formed.

As shown in FIG. 3B, because the upper electrode 15 is uniformly formed on the memory layer 14 in a general magnetic memory device 100, the heat generated at the memory layer diffuses quickly through the upper electrode so that the temperature distribution in the memory layer is nearly equal.

As illustrated in FIGS. 2A and 2B, in the magnetic memory device 1 of the present embodiment, as described above, the upper electrode 15 has a concave like cross section and the depressed portion is filled with a low heat conductivity part 18 so that the temperature of the center portion seen from the layer surface direction of the memory layer 14 is accelerated.

<3. The First Example of the Structure and a Manufacturing Order>

If it is supposed that the structure example of the magnetic memory device 1 of the embodiment shown in FIGS. 2A and 2B is a first structure example, one example of a method for manufacturing the magnetic memory device 1 is shown in FIGS. 4A to 4D.

Figure 4A:
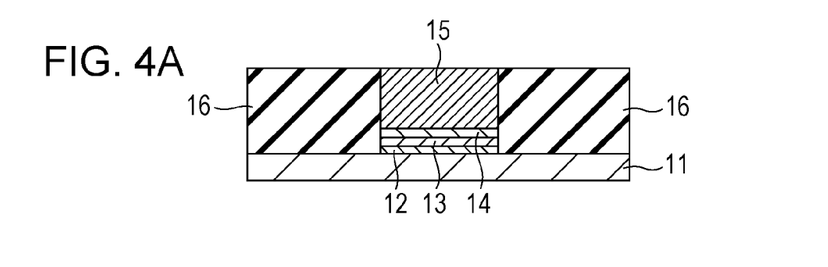
FIGS. 4A to 4D are a view illustrating a first structure example and the process sequence of the magnetic memory device according to the embodiment.

First of all, FIG. 4A indicates a state formed with the lower electrode 11, the reference layer 12, the nonmagnetization layer 13, the memory layer 14, the upper electrode 15, and insulator 16 by the same process such as the general magnetic memory device 100 in FIG. 3B.

In other words, the reference layer 12, the nonmagnetization layer 13, the memory layer 14, and electrode material are laminated on the lower electrode 11. After that, a photoresist is coated along the area covering the device, and the shape of the device is formed under the resist by ion milling or reactive ion etching. Next, after providing insulator material, polishing is conducted until the upper electrode 15 is exposed so that a layer forming state is obtained in which the surroundings are made of an insulating layer 16 and the upper electrode 15 is filled therein as shown in FIG. 4A.

Figure 4B:
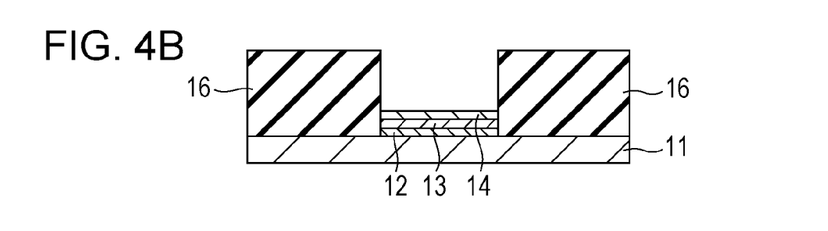

Then, from the state of FIG. 4A, the upper electrode 15 is removed as shown in FIG. 4B by selective etching on the material of the upper electrode 15.

Figure 4C:
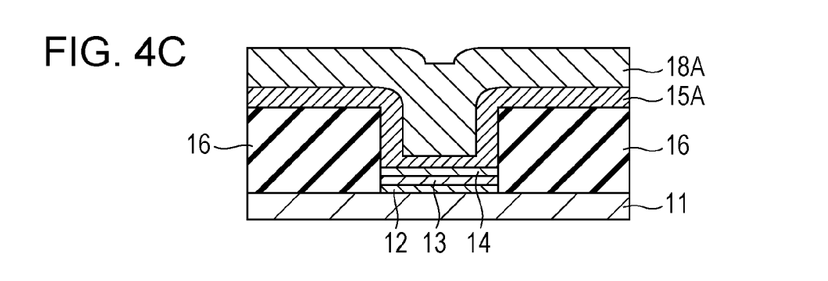
Figure 4D:
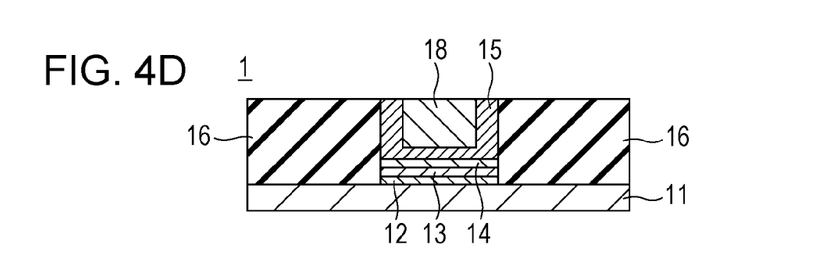

Next, as shown in FIG. 4C, a layer of electrode material 15A which is the new upper electrode 15 on the upper surface is formed, and also a layer of a low heat conductivity material 18A is formed.

In order to satisfactorily deposit the material even on the wall in the hollow formed after removal of the upper electrode 15 as shown in FIG. 4B, the forming method for these is preferably CVD (Chemical Vapor Deposition), a bias sputtering method, or the like.

Then, the layer formed on the outside (the upper side) of the hollow is removed. Therefore, it becomes like FIG. 4D, in other words, the magnetic memory device 1 is formed having the upper electrode 15 with a concave cross section and having the low heat conductivity part 18 filled with the low heat conductivity material 18A in the depressed portion of the concave shape.

Then, the wiring 6 is formed so that a state like FIG. 2B is accomplished.

<4. The Second Example of the Structure and a Manufacturing Order>

As another embodiment, a second structure example and the manufacturing process will be explained with reference to FIGS. 5A to 5E.

With regard to the shape of the magnetic memory device 1 in FIGS. 4A to 4D, although this is a case in which the width of the column is constant in respect to the height, a case in which the width is narrowed in contrast to the height like a cone is easily fabricated. One example as the structure of the device with a cone-like shape is provided in FIGS. 5A to 5E.

Figure 5A:
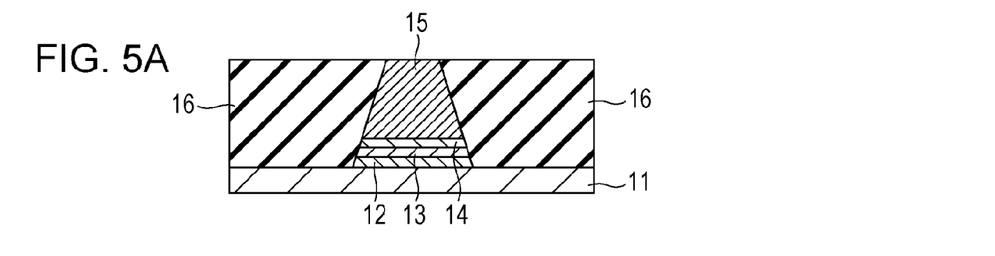
FIGS. 5A to 5E are a view illustrating a second structure example and the process sequence of the magnetic memory device according to the embodiment.

FIG. 5A shows a cross section of a magnetic memory device formed in such a cone-like shape. The reference layer 12, the nonmagnetization layer 13, the memory layer 14, and the upper electrode 15 are formed in a cone-like shape on the lower electrode 11 and the insulating layer 16 is formed on surroundings thereof. In this step, it can be said that a general magnetic memory device with cone like shape is formed.

Figure 5B:
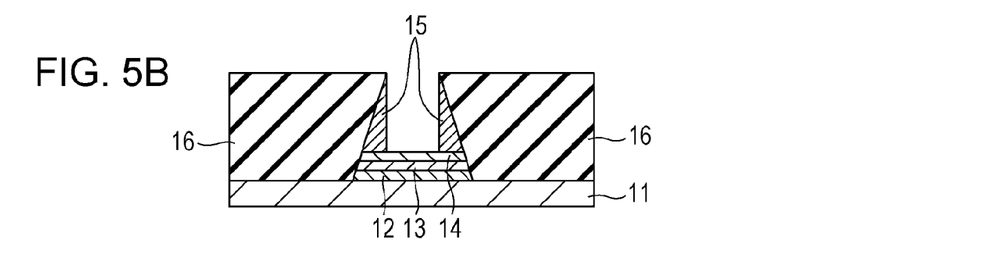

In the example of the magnetic memory device in FIG. 5A, the material of the electrode is etched from above with an ion beam having high linearity and highly selective etching. Accordingly, as shown in FIG. 5B, part of the upper electrode 15 remains in order to make a cylindrical hollow. In other words, a hollow with a cylindrical shape is formed.

Figure 5C:
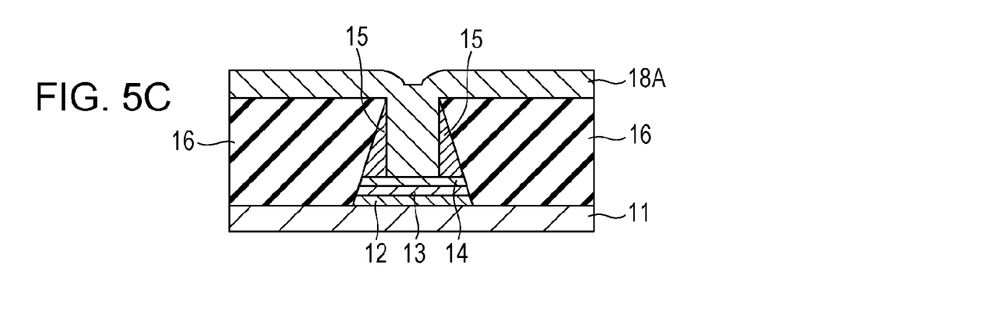

After that, a low heat conductivity material 18A is filled therein as shown in FIG. 5C.

Figure 5D:
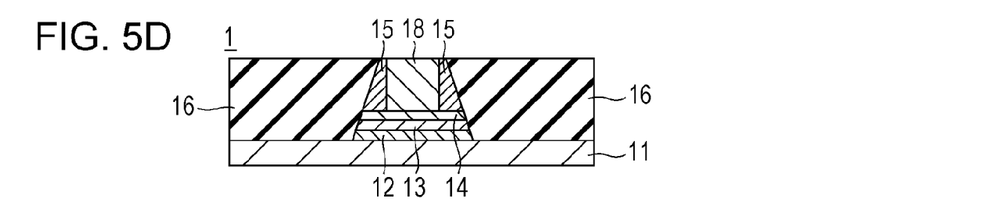

Then, if it is polished until it is thinner than the state of FIG. 5A, part of the upper electrode 15 is exposed on the surface as shown in FIG. 5D.

In the magnetic memory device 1 shown in FIG. 5D, the upper electrode 15 is formed in a pipe shape, and a low heat conductivity part 18 filled with an insulator of low heat conductivity is formed in the pipe shape.

Figure 5E:
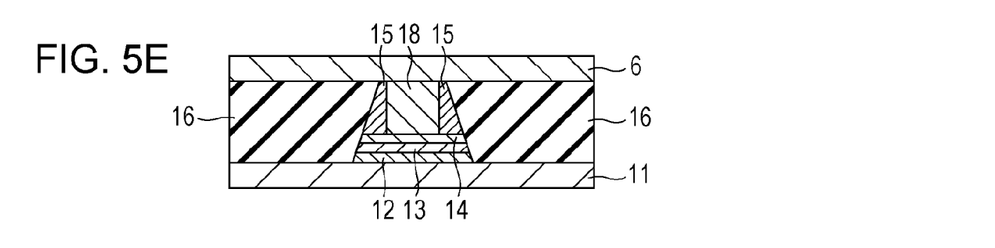

As shown in FIG. 5E, after forming the magnetic memory device 1 like this, if the wiring 6 is provided on the surface, the heat conductivity at the surroundings in the direction of the layer surface of the memory layer 14 improves, and the heat conductivity at the center portion deteriorates.

<5. The Third Example of the Structure and a Manufacturing Order>

A third structure example capable of simplifying the making of the magnetic memory device 1 and the manufacturing process will be explained with reference to FIGS. 6A to 6E.

Figure 6A:
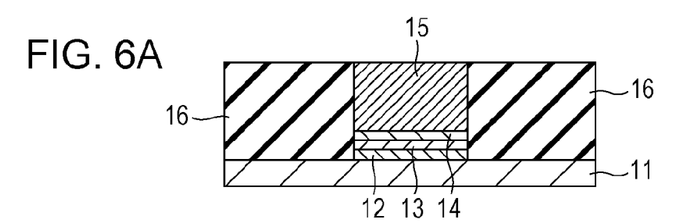
FIGS. 6A to 6E are a view illustrating a third structure example and the process sequence of the magnetic memory device according to the embodiment.

FIG. 6A shows the same state of FIG. 4A. However, it is preferable to make the etching rate of the electrode material of the upper electrode 15 higher than that of the surrounding insulator.

Figure 6B:
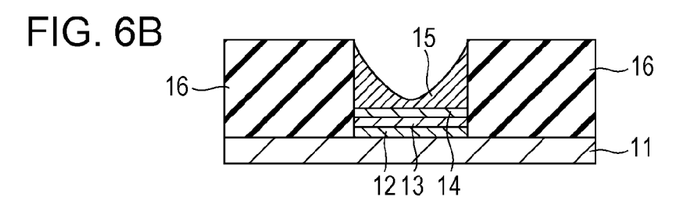

If the device in FIG. 6A is etched obliquely from the top in a diagonal direction by ion milling or the like, a shape with a depressed portion in a center portion is formed as shown in FIG. 6B because of sputtering or reattachment of constituent devices.

Figure 6C:
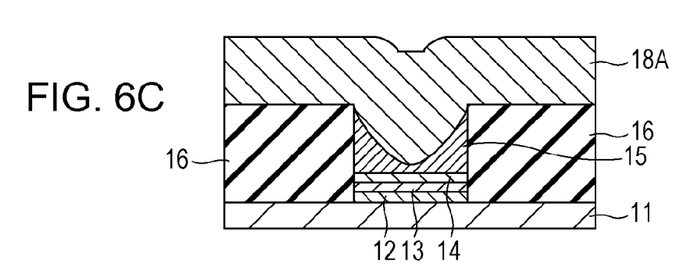

The material 18A with a low heat conductivity is filled in this depressed portion as shown in FIG. 6C.

Figure 6D:
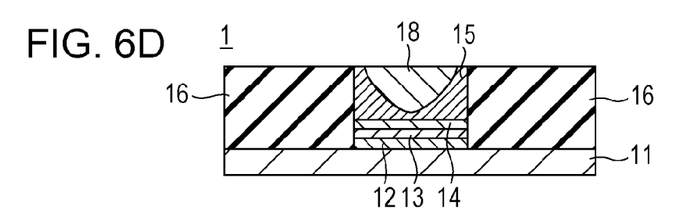

Then, if polishing is conducted till the insulating layer 16 becomes thinner than the state of FIG. 6A, part of the upper electrode 15 is exposed on the surface as shown in FIG. 6D.

In the magnetic memory device 1 shown in FIG. 6D, the cross section of the upper electrode 15 is substantially a concave shape, and a low heat conductivity part 18 which is filled by an insulator with low heat conductivity is formed in the depressed portion of the concave-like shape.

Figure 6E:
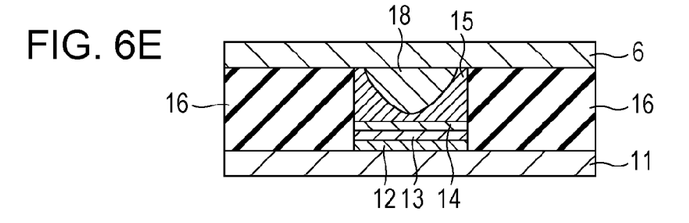

After forming the magnetic memory device 1, the wiring 6 is provided on the surface as shown in FIG. 6E.

In this case, it is possible to improve the heat conductivity at the surroundings in the direction of layer surface of the memory layer 14, and allow the heat conductivity at the center portion to deteriorate.

<6. The Fourth Example of the Structure and a Manufacturing Order>

Hereinafter, a fourth structure example and the manufacturing process will be explained with reference to FIGS. 7A to 7F.

This is an example of the forming of the low heat conductivity part 18 in the forming process of the upper electrode 15.

Figure 7A:
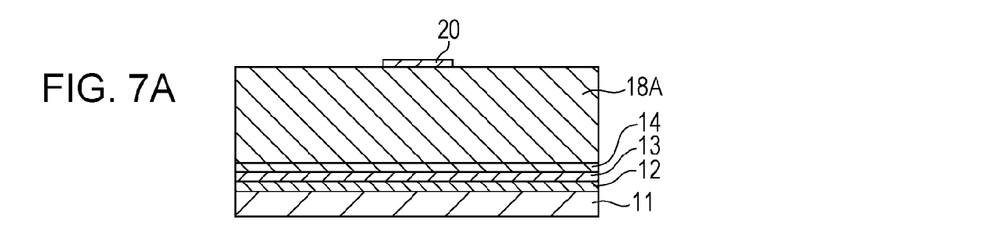
FIGS. 7A to 7F are a view illustrating a fourth structure example and the process sequence of the magnetic memory device according to the embodiment.

FIG. 7A shows the state in which the reference layer 12, the nonmagnetization layer 13, the memory layer 14 and the low heat conductivity material 18A are laminated sequentially on the lower electrode 11. Here, a mask 20 for etching is formed in order to form a column of low heat conductivity material 18A.

Figure 7B:
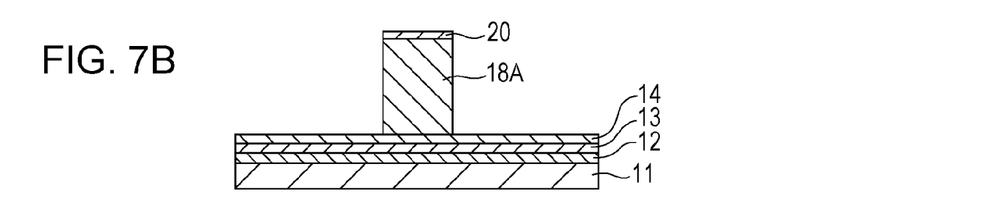

Then, a column of low heat conductivity material 18A is formed as shown in FIG. 7B by etching under a condition for selectively etching the low heat conductivity material 18A.

Figure 7C:
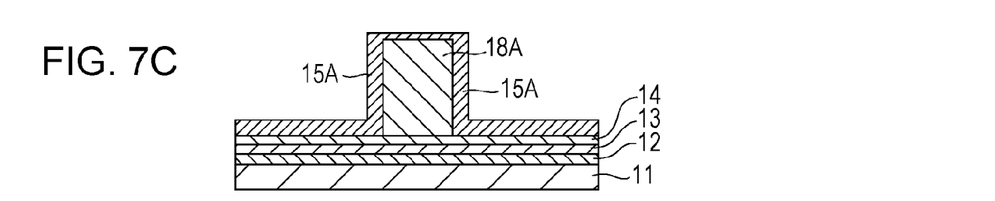

Next, an electrode material (metal layer) 15A which will be an upper electrode 15 is similarly formed as shown in FIG. 7C. Here, the formed metal layer is preferably one having a good heat conductivity and being difficult to etch under specific conditions, and W, Mo, Ru, Rh, Ir, or the like may be used.

Figure 7D:
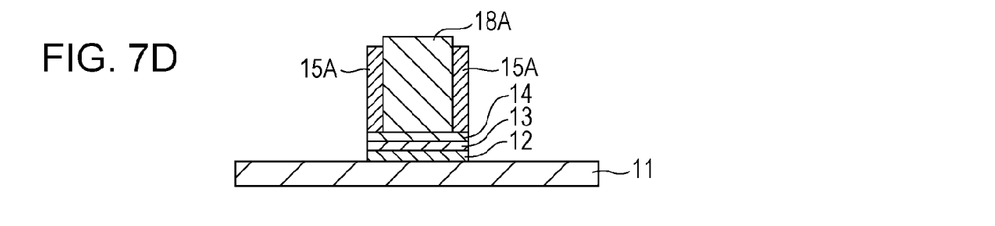

Then, as shown in FIG. 7D, only the electrode material 15A on the surroundings of the low heat conductivity material 18A having a column like shape remains from the top of the device, and etching is performed so that at least the necessary portion of the memory layer 14 remains.

Figure 7E:
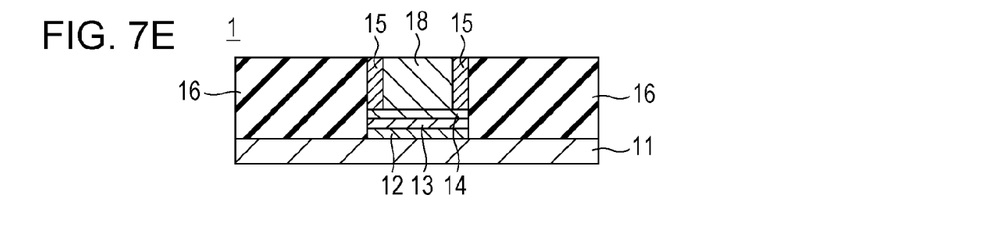

Then, after forming insulating layer 16 by applying insulating material around the device, a planarization process is performed on the upper surface to attain the state shown in FIG. 7E.

In the magnetic memory device 1 shown in FIG. 7E, the upper electrode 15 is formed as a tube shape, and the low heat conductivity part 18 filled by an insulator of low heat conductivity is formed in the inner part of the tube.

Figure 7F:
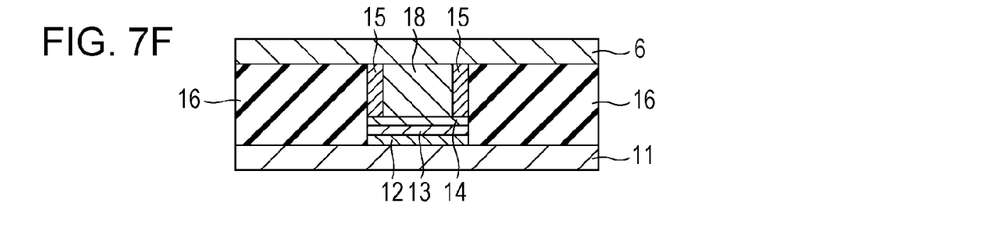

After forming the magnetic memory device 1 like this, the wiring 6 is formed on the upper surface as shown in FIG. 7F. Therefore, it is possible to manufacture a magnetic memory device 1 having superior heat conductivity at the surroundings of the memory layer 14 in the direction of the layer surface and having inferior heat conductivity at the center portion.

<7. Embodiment>

For example, in each example explained above, with respect to the memory layer 14, it is possible to obtain an upper electrode structure with high heat conductivity at the center portion in the direction of the layer surface, and promote the temperature rise at the center portion of the memory layer 14 at the time of memorization.

For example, an embodiment of the present disclosure when adopting the process of FIGS. 6A to 6E will be explained below.

Figure 8A:
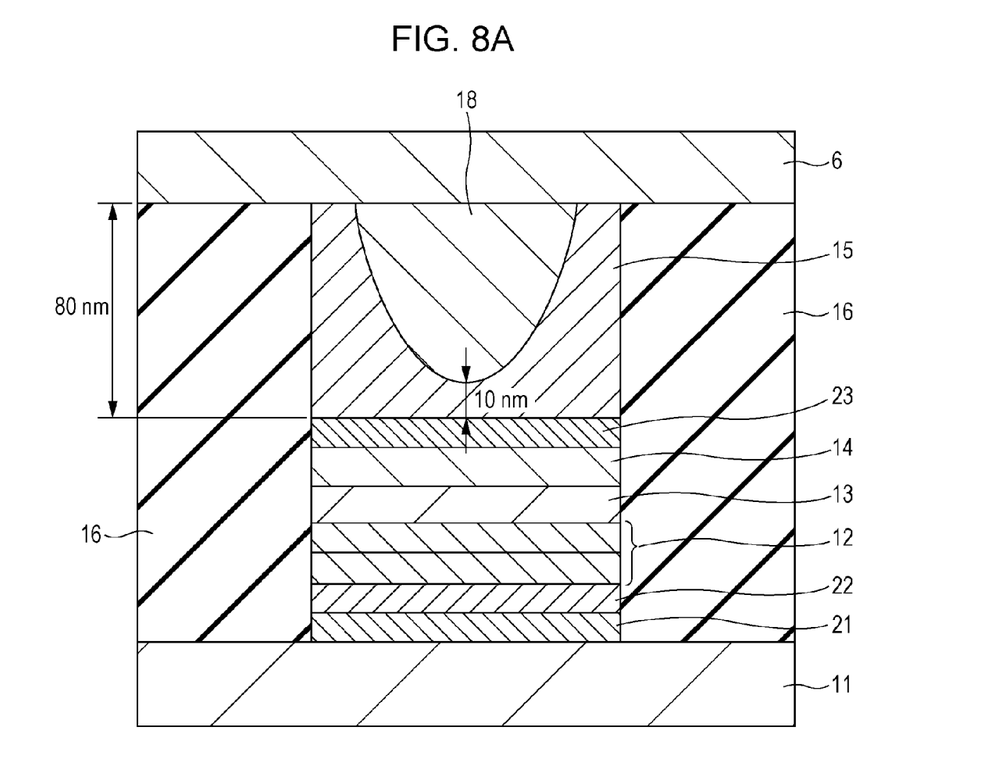
FIGS. 8A and 8B are a view illustrating a specific example of the magnetic memory device structure according to the embodiment.

FIG. 8A schematically shows a layer structure of the embodiment.

First, a 5 nm Ta layer 21, which will be one part of the lower electrode 11 and functions as a protective layer, is provided on the lower electrode 11 made of W (tungsten). A 5 nm Ru layer 22 which is a base layer thereon in provided.

Then, as a reference layer 12, a 2 nm CoPt layer and a 1 nm CoFeB layer are provided.

Also, MgO with a thickness of 0.8 nm is formed to make a nonmagnetization layer 13.

Figure 8B:
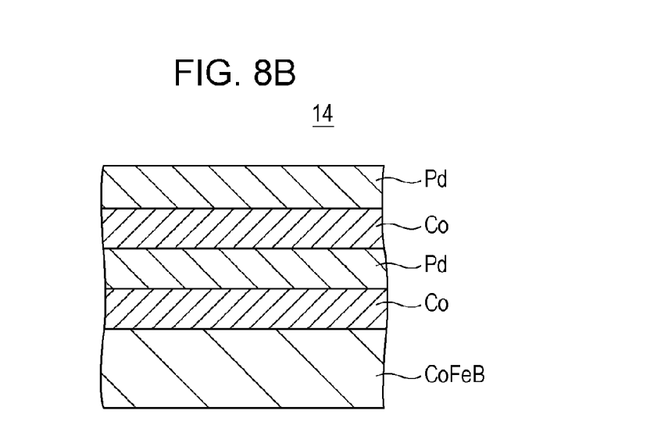

The memory layer 14 is an alternately laminated layer of a 1 nm of CoFeB and Co/Pd. For example, as shown in FIG. 8B, in the memory layer 14, Co layers and Pd layers are alternately laminated on the upper surface of the CoFeB layer. Each sample shown in the following FIG. 9B shows an experimental case when the thickness of each layer of the alternately laminated Co/Pd and the total thickness thereof are changed in order to adjust the coercive force of the memory layer 14.

The 5 nm Ta layer 23 which is one part of the upper electrode and has a function as a protective layer is provided on the top surface of the memory layer 14, and a W layer is formed as the upper electrode 15.

Here, as explained in FIGS. 6A to 6E, the upper electrode 15 of a W layer is formed by etching the electrode layer with ion milling from the surroundings, so the cross section is substantially concave and the depressed portion is a low heat conductivity part 18.

The magnetic memory device 1 has a size of 150 nm in diameter, the thickness of surroundings of the upper electrode 15 is 80 nm, and the recess is formed such that the center portion has a thickness of 10 nm.

The low heat conductivity material which is provided for the depressed portion is $SiO_2$.

The insulating layer 16 is using $Al_2O_3$.

Although not shown, in respect to this embodiment, a comparative example having the same layer structure except for the upper electrode 15 was prepared.

In the comparative example, the low heat conductivity part 18 is not formed in the upper electrode 15, and the thickness of the upper electrode 15 as a W layer is set to a constant 100 nm in the direction of the entire layer surface.

The device resistance in both the embodiment and the comparative example is 2 to 3 kΩ in a state of parallel magnetization.

Figure 9A:
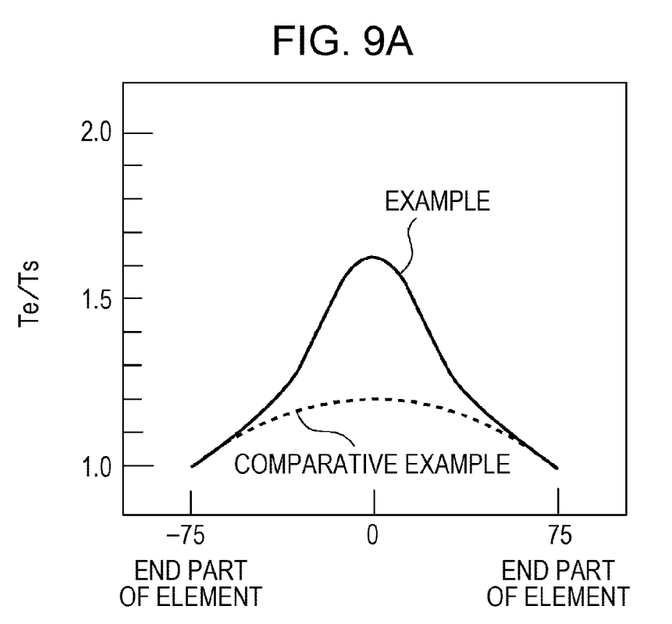
FIGS. 9A and 9B are a view illustrating calculated results of temperature distribution, and the relationship of a ratio of coercive force and reversal voltage at temperatures of 200° C. and 23° C. according to the embodiment and the comparative example.
Figure 9B:
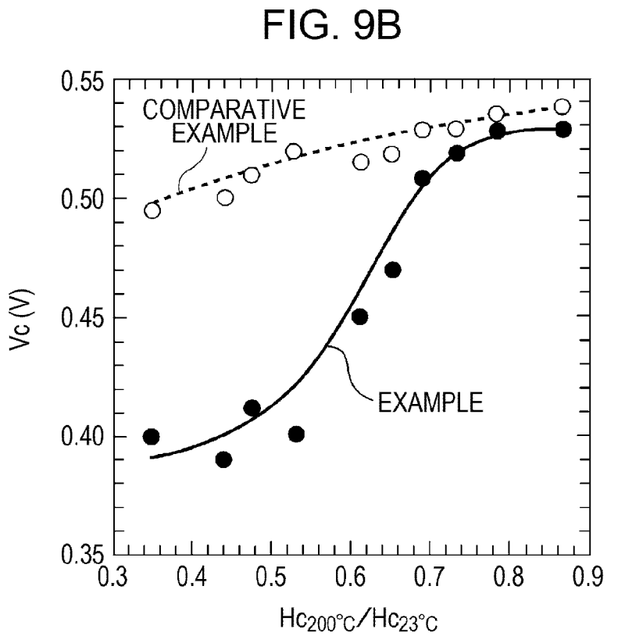

FIG. 9A shows the calculated results of the relative temperature rises of both the comparative example and the embodiment when the memory layer 14 generates heat uniformly.

The horizontal axis denotes the distance (nm) from the center of the layer surface of the device. The vertical axis denotes the ratio of temperature difference (Ts) and temperature difference (Te), wherein the temperature difference (Ts) means a difference between the ambient temperature and the temperature of the end portion of the device and the temperature difference (Te) means a difference between the temperature of the memory layer 14 and the surrounding temperature depending on the distance (0±75 μl) from the center.

Here, the expression "ambient temperature" means the temperature of the environment which is the temperature at a distance sufficiently removed from the magnetic memory device 1, for example, room temperature. Also, the "the end portion of the device" in this example means the surroundings of the circular part of the memory layer 14 as the layer has a circular layer surface.

Because the memory layer 14 has a circular layer surface, the temperature distribution is symmetrical about the center. The distance 0 is the center of the circular memory layer 14 and the distance ±75 μm is the end portion of the circle.

As shown in FIG. 9A, although the temperature difference ratio of Te/Ts at the center portion in the direction of the layer surface in the comparative example is about 1.2, the ratio in embodiment is expected to be about 1.6. That is, it is possible to obtain a prominent temperature rise in the vicinity of the center portion of the later surface of the memory layer 14 with respect to the surroundings (the end portion of the device).

In the structure of the embodiment and the comparative example described above, FIG. 9B shows the memorization voltage (a voltage necessary to reverse the magnetization) when the temperature characteristics of the coercive force of the memory layer 14 are changed. The vertical axis denotes memory voltage Vc, and the horizontal axis denotes the ratio of the coercive force (Hc 200° C.) at a temperature of 200° C. which is a general temperature during memorization and the coercive force (Hc 23° C.) at a room temperature of 23° C.

Black circle denotes a sample of the embodiment, and white circle denotes a sample of the comparative example. In each structure, the ratio (Hc 200° C./Hc 23° C.) of the coercive force can vary by adjusting each layer and the entire thickness of the layers of the alternately laminated layers of Co/Pd of the memory layer 14. The memory layer 14 was adjusted in order to produce a coercive force of 400 to 600 Oe at a temperature of 23° C.

The memory voltage Vc shows the average of both positive and negative polarities at a pulse width of about 10 ns.

Meanwhile, regarding the coercive force of the memory layer 14 of the device, when there is no external magnetic field due to a leakage magnetic field from the reference layer 12, since a difference occurs in coercive force from parallel to semi-parallel, calculation was performed while applying a certain external magnetic field to cancel the leakage magnetic field from the reference layer 12.

In the comparative example, if the ratio of the coercive force at temperatures of 200° C. and 23° C. is lowered, the voltage for reversal is reduced little by little, but with only a small amount of change.

Meanwhile, in the embodiment, if the ratio (Hc 200° C./Hc 23° C.) of the coercive force at temperatures of 200° C. and 23° C. is 0.7 or less, the voltage for reversal is reduced rapidly.

Therefore, in a structure of the embodiment, it is possible to realize nonvolatile memory operable at high speed with low current by making the ratio (Hc 200° C./Hc 23° C.) of coercive force of the memory layer 14 0.7 or less.

Meanwhile, in order to hold true when the coercive force is 0 at a temperature of 200° C., although it is possible for the ratio of coercive force to be 0, the reason for the large deterioration in the coercive force at 200° C. is that the variance is high at room temperature. For this reason, it is preferable to have a stable coercive force at around room temperature, and it is more preferable to make the ratio of the coercive force 0.3 or greater.

Accordingly, although it is preferable to make the ratio (Hc 200° C./Hc 23° C.) of coercive force 0.7 or less, it is more effective to make it 0.3 or more and 0.7 or less.

As explained hereinbefore, the magnetic memory device 1 of the embodiment includes a memory layer 14 having a vertical magnetization on the layer surface and changing the direction of the magnetization according to information, and a reference layer 12 provided to the memory layer 14 through the nonmagnetization layer 13 and having a vertical magnetization on the layer surface while having a fixed magnetization direction. Furthermore, information is memorized by the magnetization reversal of the memory layer 14 caused by a spin torque generated when current flows between layers made from the memory layer 14, the nonmagnetization layer 13, and the reference layer 12.

In this structure, it is preferable to make the coercive force of the memory layer 14 at a memorization temperature 0.7 times or less than that at room temperature. Furthermore, it is preferable to make the heat conductivity of the center portion of the upper electrode 15 in the direction of the layer surface formed on one side of the memory layer 14 less than that of the peripheral part.

By structuring like this, effective magnetization reversal is realized by the temperature rise at the center portion of the memory layer 14, and a current for memorization and a time for memorization can be reduced.

In particular, as shown in FIGS. 4A to 4D and FIGS. 6A to 6E, the thickness of the cross section of the central part of the upper electrode 15 is thinner than that of the circumference part of the upper electrode 15 so that the cross section is approximately a concave-like shape, and an insulator of low heat conductivity is filled into the depressed portion formed in the center portion. Alternatively, as shown in FIGS. 5A to 5E and FIG. 7A to 7F, the upper electrode 15 is formed in a tube shape, and the internal part of the tube shape is filled with an insulator of low heat conductivity. Accordingly, as well as realizing the embodiment of the magnetic memory device 1 with comparative ease, it is effective to reduce the current for memorization and the time for memorization.

The embodiment has been explained, but the structure of the magnetic memory device 1 or the method for manufacturing the magnetic memory device 1 is not restricted to the embodiment. The materials of the memory layer 14, the nonmagnetization layer 13, the reference layer 12, the upper electrode 15, the low heat conductivity part 18, or the like, and the shape and the like of the upper electrode 15 for providing the low heat conductivity part 18 are variously considered.

The present disclosure contains subject matter related to that disclosed in Japanese Priority Patent Application JP 2010-177104 filed in the Japan Patent Office on Aug. 6, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic memory device comprising:
    a memory layer having a vertical magnetization on the layer surface, of which the direction of magnetization is changed according to information; and
    a reference layer provided against the memory layer through a nonmagnetization layer, and being a basis of information while having a vertical magnetization on the layer surface,
    wherein the memory device memorizes the information by reversing the magnetization of the memory layer by a spin torque generated when a current flows between layers made from the memory layer, the nonmagnetization layer and the reference layer, and
    a coercive force of the memory layer at a memorization temperature is 0.7 times or less than a coercive force at room temperature, and
    a heat conductivity of a center portion of an electrode formed on one side of the memory layer in the direction of the layer surface is lower than a heat conductivity of surroundings thereof.

2. The magnetic memory device according to claim 1, wherein the electrode is formed to substantially have a concave cross section in which a thickness of the center portion thereof is thinner than that of the surroundings thereof, and an insulator of low heat conductivity is filled into a depressed portion formed at the center portion.

3. The magnetic memory device according to claim 1, wherein the electrode is formed to have a tube-like shape, and an inner part of the tube-like shape is filled with an insulator of low heat conductivity.

4. A method of manufacturing a magnetic memory device comprising a memory layer having a vertical magnetization on the layer surface, of which the direction of the magnetization is changed according to information; and a reference layer provided against the memory layer through a nonmagnetization layer, and being a basis of information while having a vertical magnetization on the layer surface, in which the memory device memorizes the information by reversing the magnetization of the memory layer by a spin torque generated when a current flows between layers made from the memory layer, the nonmagnetization layer and the reference layer, the method comprising:
    forming a layer structure having at least the reference layer, the nonmagnetization layer and the memory layer on an electrode of the reference layer side, and making the layer structure have a coercive force of the memory layer at a memorization temperature being 0.7 times or less than a coercive force at room temperature; and
    forming another electrode which is filled with an insulator of low heat conductivity, and of which a heat conductivity of a center portion in the direction of the layer surface is lower than a heat conductivity of its surroundings, on one side of the memory layer.

* * * * *